(12) United States Patent
Sunder et al.

(10) Patent No.: US 12,107,556 B2
(45) Date of Patent: Oct. 1, 2024

(54) FAULT DETECTION IN INTEGRATED CIRCUITS

(71) Applicant: Cisco Technology, Inc., San Jose, CA (US)

(72) Inventors: Sanjay Sunder, Allentown, PA (US); Alexander C. Kurylak, Bethlehem, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 449 days.

(21) Appl. No.: 17/448,822

(22) Filed: Sep. 24, 2021

(65) Prior Publication Data

US 2023/0100245 A1 Mar. 30, 2023

(51) Int. Cl.
*H03F 3/45* (2006.01)
*H03G 3/30* (2006.01)

(52) U.S. Cl.
CPC ........... *H03F 3/45475* (2013.01); *H03G 3/30* (2013.01); *H03G 2201/103* (2013.01)

(58) Field of Classification Search
CPC .......... H03F 3/45475; H03F 1/34; H03F 1/08; H03G 3/30; H03G 2201/103

USPC .............................. 330/308, 254, 298, 207 P
See application file for complete search history.

(56) References Cited

U.S. PATENT DOCUMENTS

| | | |
|---|---|---|
| 6,624,405 B1 | 9/2003 | Lau et al. |
| 10,505,509 B2 | 12/2019 | Lakshmikumar et al. |
| 11,885,646 B2 * | 1/2024 | Myers .................... G01D 18/00 |
| 2013/0259470 A1 | 10/2013 | Zhong et al. |
| 2018/0335509 A1 | 11/2018 | Aksin et al. |
| 2020/0256759 A1 | 8/2020 | Grosse et al. |
| 2022/0321811 A1 * | 10/2022 | Myers .................. H04N 25/671 |

FOREIGN PATENT DOCUMENTS

| | | |
|---|---|---|
| CN | 110545083 A | 12/2019 |
| JP | 2008070277 A | 3/2008 |

* cited by examiner

*Primary Examiner* — Hieu P Nguyen
(74) *Attorney, Agent, or Firm* — Patterson + Sheridan, LLP (57) ABSTRACT

An integrated circuit includes a transimpedance amplifier and an injection circuit. The injection circuit generates a first electrical test signal and injects the first electrical test signal into the transimpedance amplifier. The first electrical test signal or an output of the transimpedance amplifier generated based on the first electrical test signal is used to determine whether the integrated circuit is faulty.

18 Claims, 8 Drawing Sheets

FAULT DETECTION IN INTEGRATED CIRCUITS

TECHNICAL FIELD

Embodiments presented in this disclosure generally relate to integrated circuit testing. More specifically, embodiments disclosed herein relate to fault detection in integrated circuits using electrical test signals.

BACKGROUND

Transimpedance amplifiers are included in many optical circuits. Testing these circuits, however, can be costly because the optical components in these circuits can be expensive. If a fault is detected in the circuit after the optical components are assembled into the circuit, then the circuit and the optical components are discarded, resulting in severe waste.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

According to an embodiment, an integrated circuit includes a transimpedance amplifier and an injection circuit. The injection circuit generates a first electrical test signal and injects the first electrical test signal into the transimpedance amplifier. The first electrical test signal or an output of the transimpedance amplifier generated based on the first electrical test signal is used to determine whether the integrated circuit is faulty. Other embodiments include a method performed in the integrated circuit.

According to another embodiment, a system includes a first integrated circuit and a second integrated circuit connected to the first integrated circuit. The first integrated circuit includes a transimpedance amplifier and an injection circuit that injects a first electrical test signal into an output of the transimpedance amplifier. A fault in a connection between the first integrated circuit and the second integrated circuit is determined based on whether the first electrical test signal is received at an input of the second integrated circuit.

EXAMPLE EMBODIMENTS

This disclosure describes injecting electrical test signals into different portions of a transimpedance amplifier in an integrated circuit to test the integrated circuit. For example, an injection circuit may inject electrical test signals into an input of the transimpedance amplifier, an output of the transimpedance amplifier, or an input of a component within the transimpedance amplifier (e.g., a programmable gain amplifier). The electrical test signals are then used to test the components of the transimpedance amplifier and the connections of the transimpedance amplifier (e.g., input and output connections). As a result, the injection circuit can test the integrated circuit before assembling or coupling optical components to the integrated circuit. If a fault is detected, the integrated circuit can be discarded without also discarding expensive optical components that are connected to the integrated circuit in a downstream assembly process, reducing waste.

Figure 1:
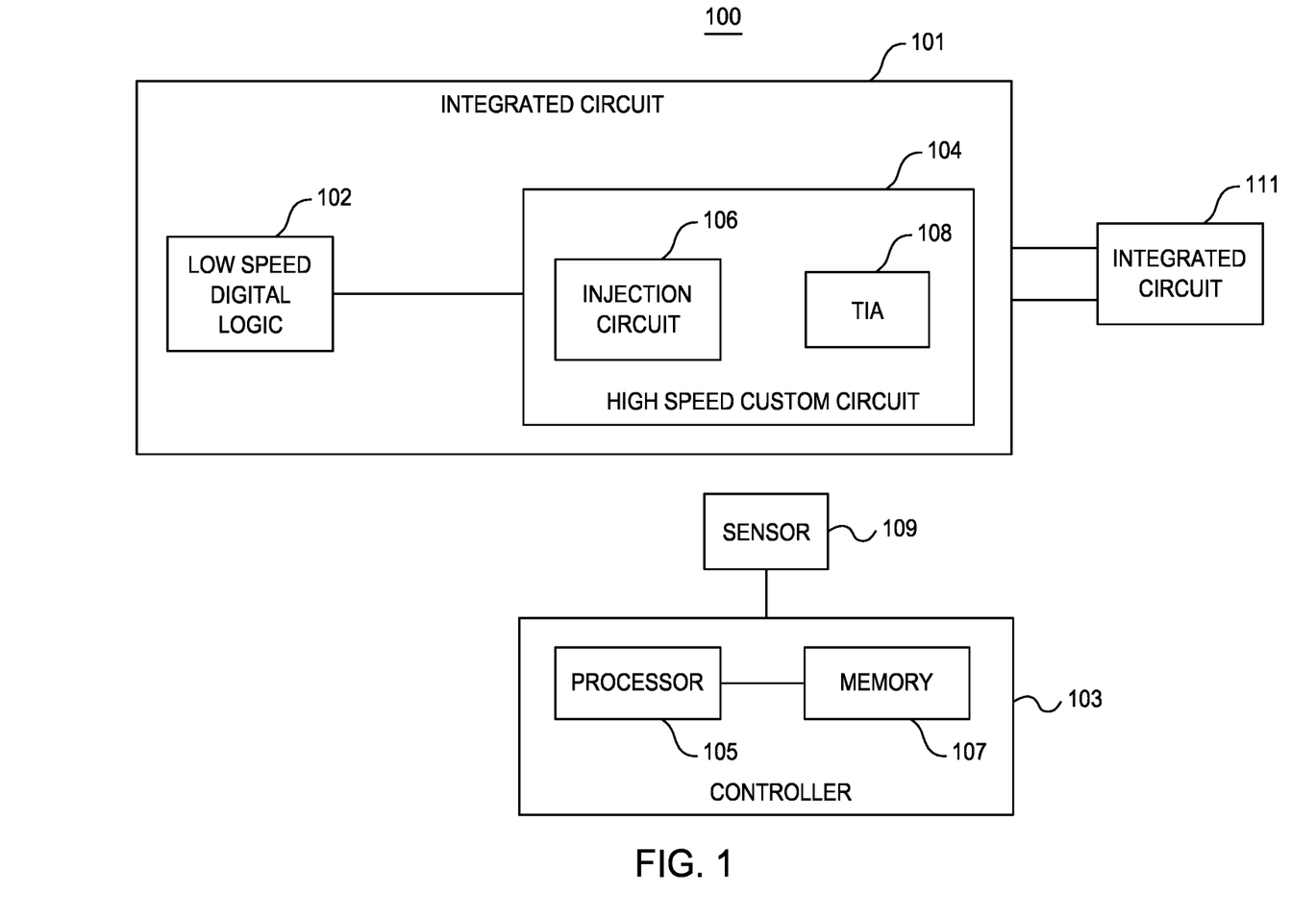
FIG. 1 illustrates an example system.

FIG. 1 illustrates an example system 100. As seen in FIG. 1, the system 100 includes an integrated circuit 101, a controller 103, and a sensor 109. The integrated circuit 101 includes any suitable components including transistors, analog circuit components, digital logic, and/or optical components. These components may be arranged in the integrated circuit 101 in any suitable manner such that the integrated circuit 101 performs any suitable function. The integrated circuit 101 includes low speed digital logic 102 and a high speed custom circuit 104. The low speed digital logic 102 is connected to the high speed custom circuit 104.

The low speed digital logic 102 may include control circuitry, such as a processor, firmware, signal generator, clock divider, and/or clock tree. These components may generate control signals for the components in the high speed custom circuit 104.

The high speed custom circuit 104 includes an injection circuit 106 and a transimpedance amplifier 108. The high speed custom circuit 104 may include any suitable number of injection circuits 106 and transimpedance amplifiers 108. The injection circuit 106 injects electrical test signals into the transimpedance amplifier 108 For example, the injection circuit 106 may inject electrical test signals into an input or an output of the transimpedance amplifier 108. As another example, the injection circuit 106 may inject electrical test signals into a component within the transimpedance amplifier 108, such as a programmable gain amplifier. The electrical test signals may be used to test the transimpedance amplifier 108 and the connections of the transimpedance amplifier 108. As a result, faults in the integrated circuit 101 may be detected using the electrical test signals. Additionally, these faults may be detected before expensive optical components are assembled or connected to the integrated circuit 101. Thus, the optical components do not need to be discarded when the fault is detected, in certain embodiments.

A sensor 109 may be used to measure, sense, or detect electrical signals from the integrated circuit 101. For example, the sensor 109 may connect to the output of the transimpedance amplifier 108 to sense or detect an output voltage generated by the transimpedance amplifier 108 based on electrical test signals injected into the input of the transimpedance amplifier 108 or into a component of the transimpedance amplifier 108. As another example, the sensor 109 may connect to an input of another integrated circuit that is connected to the output of the integrated circuit 101. The sensor 109 then detects whether electrical test signals injected into the output of the transimpedance amplifier 108 reach the other integrated circuit. Based on the detected voltages or signals (or lack thereof), a fault may be detected in the integrated circuit 101 or in a connection between the integrated circuit 101 and another component (e.g., another integrated circuit).

A controller 103 may analyze the voltages or signals from the sensor 109 to determine whether the integrated circuit 101 or a connection of the integrated circuit 101 is faulty. For example, if the controller 103 determines that the sensor 109 is not detecting an output voltage or is detecting an incorrect output voltage, then the controller 103 may determine that there is a fault within the transimpedance amplifier 108 or the integrated circuit 101. As another example, if the controller 103 determines that the sensor 109 is not detecting a signal at the input of another integrated circuit connected to the integrated circuit 101, then the controller 103 may determine that a connection between the two integrated circuits is faulty. As seen in FIG. 1, the controller 103 includes a processor 105 and a memory 107, which perform the functions or actions of the controller 103 described herein.

The processor 105 is any electronic circuitry, including, but not limited to one or a combination of microprocessors, microcontrollers, application specific integrated circuits (ASIC), application specific instruction set processor (ASIP), and/or state machines, that communicatively couples to memory 107 and controls the operation of the controller 103. The processor 105 may be 8-bit, 16-bit, 32-bit, 64-bit or of any other suitable architecture. The processor 105 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 105 may include other hardware that operates software to control and process information. The processor 105 executes software stored on the memory 107 to perform any of the functions described herein. The processor 105 controls the operation and administration of the controller 103 by processing information (e.g., information received from the sensor 109 or the memory 107). The processor 105 is not limited to a single processing device and may encompass multiple processing devices.

The memory 107 may store, either permanently or temporarily, data, operational software, or other information for the processor 105. The memory 107 may include any one or a combination of volatile or non-volatile local or remote devices suitable for storing information. For example, the memory 107 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 107, a disk, a CD, or a flash drive. In particular embodiments, the software may include an application executable by the processor 105 to perform one or more of the functions described herein.

In certain embodiments, the system 100 includes an integrated circuit 111 connected to outputs of the integrated circuit 101. The injection circuit 106 may inject electrical test signals into an output of the transimpedance amplifier 108 in the integrated circuit 101. The electrical test signals travel from the integrated circuit 101 to the integrated circuit 111 over a connection between the integrated circuit 101 and the integrated circuit 111. If the electrical test signals reach the integrated circuit 111, then the connection between the integrated circuit 101 and the integrated circuit 111 is verified. If the electrical test signals do not reach the integrated circuit 111, then the output connection of the integrated circuit 101 between the integrated circuit 101 and the integrated circuit 111 is faulty.

Figure 2:
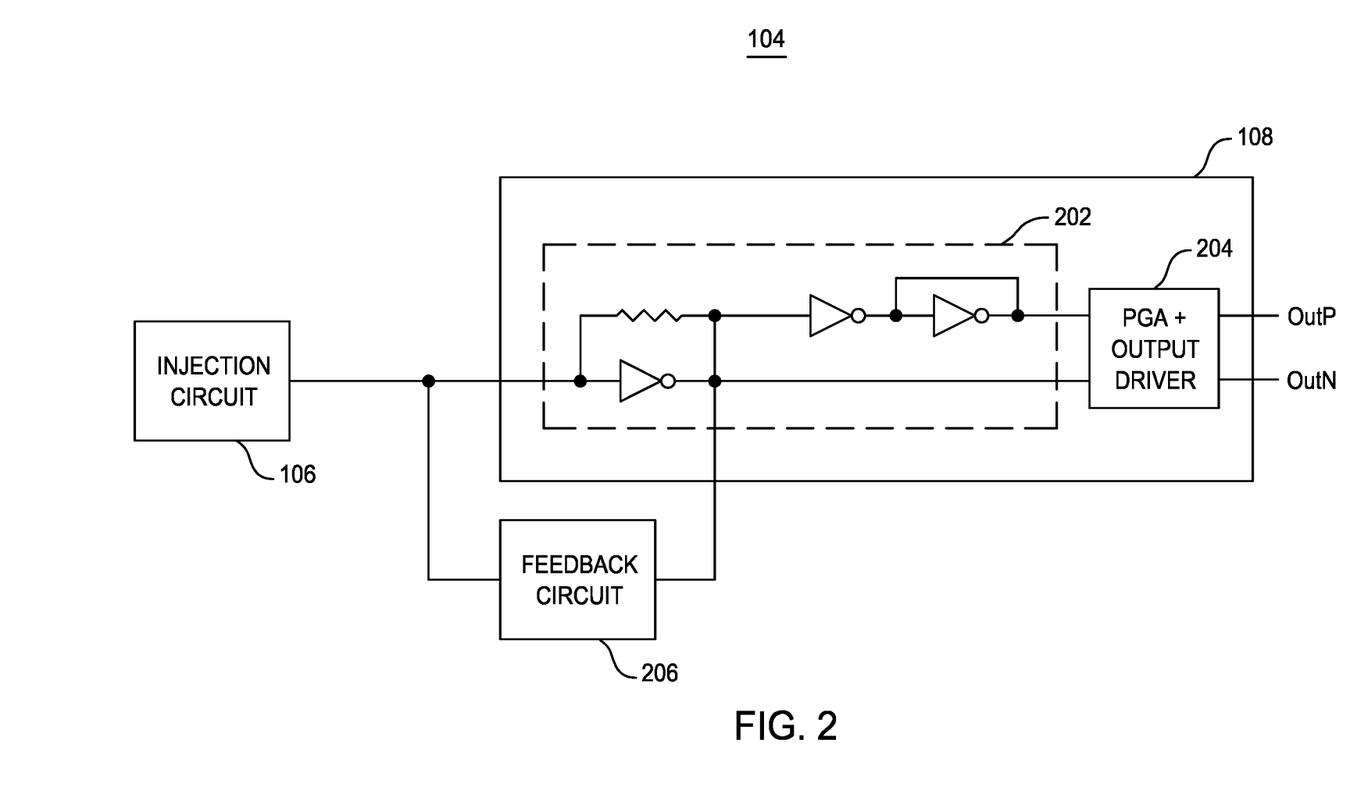
FIG. 2 illustrates an example high speed custom circuit of the integrated circuit in the system of FIG. 1.

FIG. 2 illustrates an example high speed custom circuit 104 of the integrated circuit 101 in the system 100 of FIG. 1. As seen in FIG. 2, the high speed custom circuit 104 includes the injection circuit 106, the transimpedance amplifier 108, and a feedback circuit 206. The injection circuit 106 injects electrical test signals into an input of the transimpedance amplifier 108. The feedback circuit 206 injects feedback signals into the input of the transimpedance amplifier 108. The transimpedance amplifier 108 generates an output voltage (over outP and outN) based on the electrical test signals from the injection circuit 106 and/or the feedback signals from the feedback circuit 206, in particular embodiments. The output voltage is analyzed to determine whether the transimpedance amplifier 108 is faulty.

The transimpedance amplifier 108 includes a front-end 202 and a programmable gain amplifier and output driver 204. The injection circuit 106 injects electrical test signals into the front-end 202. The front-end 202 generates an input voltage into the programmable gain amplifier and output driver 204 based on the electrical test signals. The programmable gain amplifier and output driver 204 generate the output voltage of the transimpedance amplifier 108 by amplifying the input voltage provided by the front-end 202.

As seen in FIG. 2, the front-end 202 sends electrical test signals through two branches to generate the input voltage to the programmable gain amplifier and output driver 204. The injection circuit 106 sends the electrical test signal into the shunt feedback transimpedance first stage in the front-end 202. The output of this first stage is then sent to one input of the programmable gain amplifier and output driver 204 and to an inverter stage. This inverter stage has a shorted inverter as a load, which produces a linear inversion of the input signal to be used as the other input for the programmable gain amplifier and output driver 204. It is understood that the front-end 202 shown in FIG. 2 is an example and that the front-end 202 may include any suitable components arranged in any suitable manner.

The feedback circuit 206 injects feedback signals into the input of the transimpedance amplifier 108. The feedback circuit 206 generates the feedback signals based on an input to the programmable gain amplifier and output driver 204. In some embodiments, the feedback signal generated by the feedback circuit 206 offsets a direct current (DC) component of an input signal to the transimpedance amplifier 108 (e.g., an input signal generated by an optical component). As a result, the feedback circuit 206 removes, offsets, or reduces the DC component in the input signal.

The programmable gain amplifier and the output driver 204 generate an output voltage over outP and outN based on the input voltage from the front-end 202. For example, the programmable gain amplifier and the output driver 204 may amplify and drive the input voltage to produce the output voltage. In this manner, the transimpedance amplifier 108 converts a current signal from the injection circuit 106 and the feedback circuit 206 into a voltage over outP and outN. This output voltage may be measured or analyzed (e.g., by the controller 103 and sensor 109 shown in FIG. 1) to determine whether the transimpedance amplifier 108 is faulty.

Figure 3:
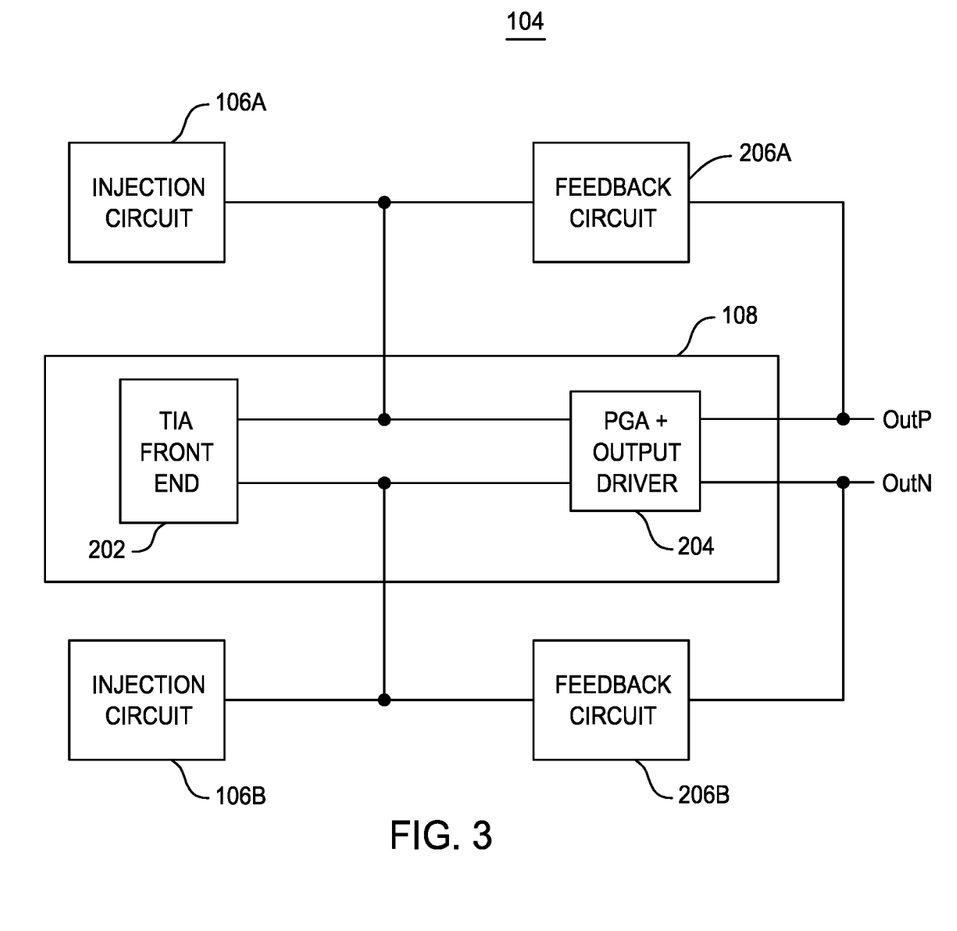
FIG. 3 illustrates an example high speed custom circuit of the integrated circuit in the system of FIG. 1.

FIG. 3 illustrates an example high speed custom circuit 104 of the integrated circuit 101 in the system 100 of FIG. 1. As seen in FIG. 3, the high speed custom circuit 104 includes injection circuits 106A and 106B, a transimpedance amplifier 108, and the feedback circuits 206A and 206B. The injection circuits 106A and 106B inject electrical test signals into the transimpedance amplifier 108. In certain embodiments, these electrical test signals are used to test the components of the transimpedance amplifier 108.

The injection circuits 106A and 106B inject electrical test signals into the inputs of the programmable gain amplifier and output driver 204. The injection circuit 106A injects a first electrical test signal into a first input of the programmable gain amplifier and output driver 204. The injection circuit 106B injects a second electrical test signal into a second input of the programmable gain amplifier and output driver 204. In some embodiments the first and second electrical test signals are complementary signals (e.g., the first and second electrical test signals sum to zero). Additionally, the first and second electrical test signals may be injected into the programmable gain amplifier and output driver 204 at the same time.

The feedback circuits 206A and 206B inject feedback signals into the inputs of the programmable gain amplifier and output driver 204. The feedback circuits 206A and 206B generate the feedback signals based on the output of the transimpedance amplifier 108. The feedback circuit 206A generates a feedback signal based on the output signal outP. The feedback circuit 206B generates feedback signals based on the output signal outN. In certain embodiments, the feedback circuits 206A and 206B generate feedback signals that offset or reduce a DC component of the input signals to the transimpedance amplifier 108. As a result, the feedback signals reduce or offset the DC component of the input signals before the input signals reach the programmable gain amplifier and output driver 204.

The programmable gain amplifier and output driver 204 generates an output voltage over outP and outN based on the electrical test signals injected by the injection circuits 106A and 106B. For example, the programmable gain amplifier and output driver 204 may amplify and drive the input voltage resulting from the electrical test signals from the injection circuits 106A and 106B to produce the output voltage. The output voltage may be measured or analyzed (e.g., by a sensor 109 and controller 103 shown in FIG. 1) to determine if the programmable gain amplifier and output driver 204 are faulty, in certain embodiments.

Figure 4:
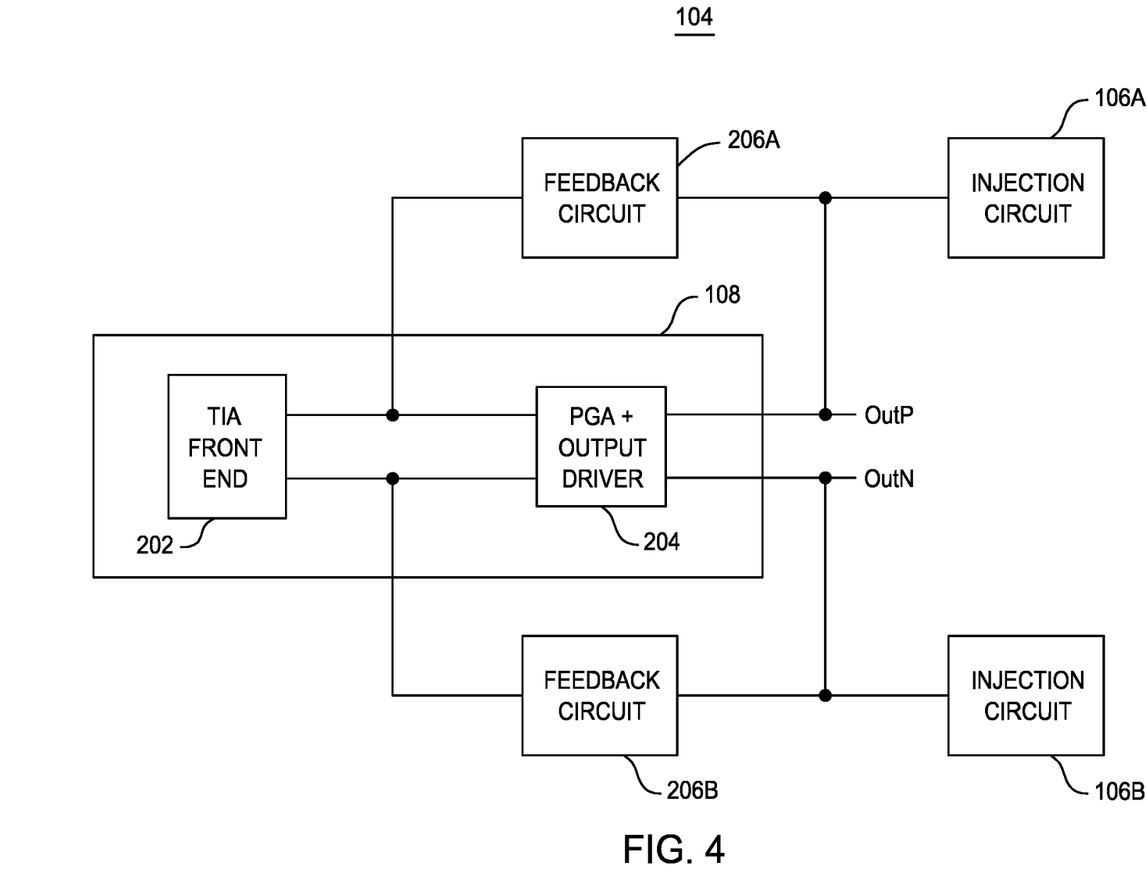
FIG. 4 illustrates an example high speed custom circuit of the integrated circuit in the system of FIG. 1.

FIG. 4 illustrates an example high speed custom circuit 104 of the integrated circuit 101 in the system 100 of FIG. 1. As seen in FIG. 4, the high speed custom circuit 104 includes injection circuits 106A and 106B, the transimpedance amplifier 108, and feedback circuits 206A and 206B. In certain embodiments, the injection circuits 106A and 1066 inject electrical test signals into the outputs of the transimpedance amplifier 108 to test the connection between the transimpedance amplifier 108 and another component.

The injection circuits 106A and 106B inject electrical test signals into the outputs of the transimpedance amplifier 108. As a result, the electrical test signals simulate an output of the transimpedance amplifier 108. The electrical test signals travel through a connection between the transimpedance amplifier 108 and another component (e.g., another integrated circuit connected to the integrated circuit 101). If the electrical test signals reach the other component, then the connection is verified. If the electrical test signals do not reach the other component, then a fault is detected in the connection. In some embodiments, the electrical test signals from the injection circuits 106A and 106B are complementary signals (e.g., the electrical test signals from the injection circuit 106A and the electrical test signals from the injection circuit 106B sum to zero). Additionally, the electrical test signals may be injected at the same time.

The feedback circuits 206A and 206B generate feedback signals based on the outputs of the transimpedance amplifier 108. The feedback circuits 206A and 206B inject the feedback signals into the inputs of the programmable gain amplifier and output driver 204 to reduce or offset a DC component of input signals to the programmable gain amplifier and the output driver 204.

Figure 5:
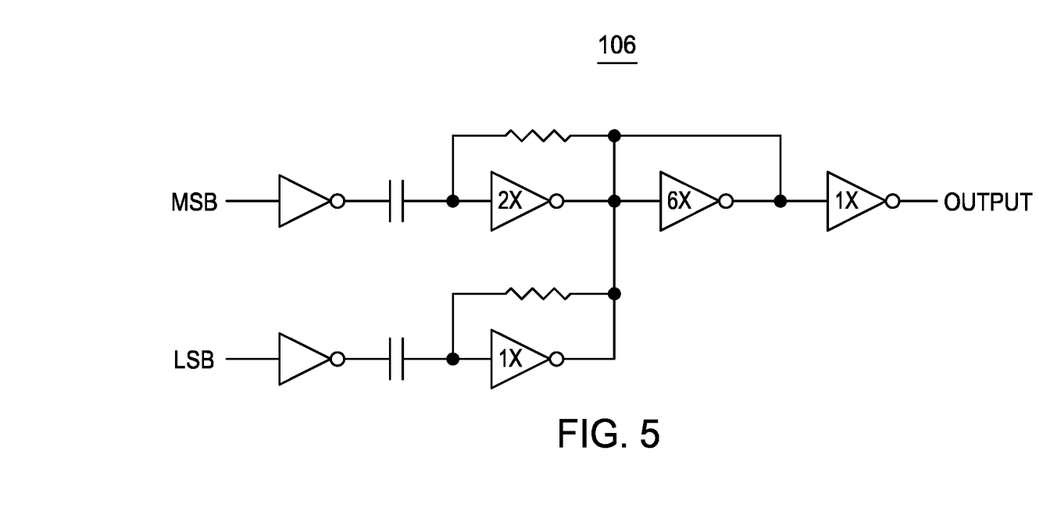
FIG. 5 illustrates an example injection circuit of the integrated circuit in the system of FIG. 1.

FIG. 5 illustrates an example injection circuit 106 of the integrated circuit in the system 100 of FIG. 1. As seen in FIG. 5, the injection circuit 106 includes two inputs and one output. The injection circuit 106 may include any suitable number of inputs. Generally, the injection circuit 106 encodes a multi-bit input signal into an output signal. For example, the injection circuit 106 may implement PAM4 encoding in which a 2-bit input is converted into an output signal with four possible amplitude levels. The amplitude of the output signals is controlled based on the bits of the input signal. In the example of FIG. 5, the injection circuit 106 receives a most significant bit and a least significant bit over the inputs to the injection circuit 106. Each of the inputs is sent through inverters, and then combined to form the output signal. Each of the inputs may be sent through inverters with different transconductances that vary the contribution of the inputs to the amplitude level of the output signal. Thus, when the outputs of the inverters are combined to form the output signal of the injection circuit 106, the amplitude of the output signal is controlled by the value of the most significant bit and the least significant bit on the inputs.

Figure 6:
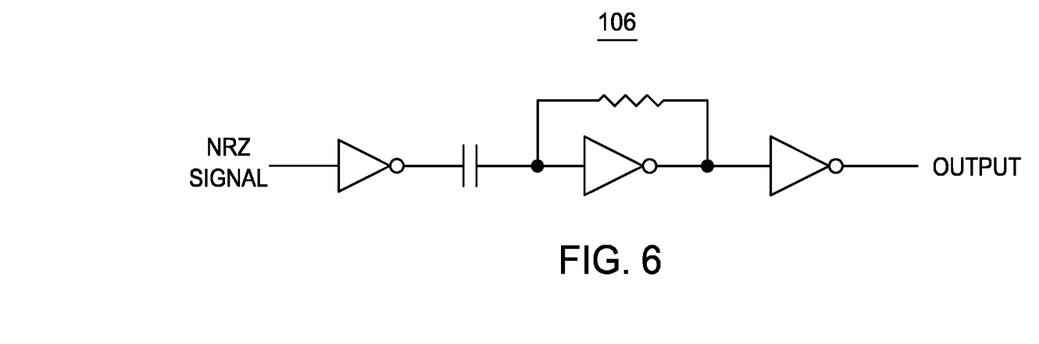
FIG. 6 illustrates an example injection circuit of the integrated circuit in the system of FIG. 1.

FIG. 6 illustrates an example injection circuit 106 of the integrated circuit 101 in the system 100 of FIG. 1. As seen in FIG. 6, the injection circuit 106 includes one input and one output. For example, the injection circuit 106 may use a non-return-to-zero (NRZ) signal on the input to generate the output signal. The injection circuit 106 includes a series of inverters that invert the NRZ signal. Additionally, the transconductances of the inverters may be different to provide different levels of output signal based on the value of the NRZ signal.

Figure 7:
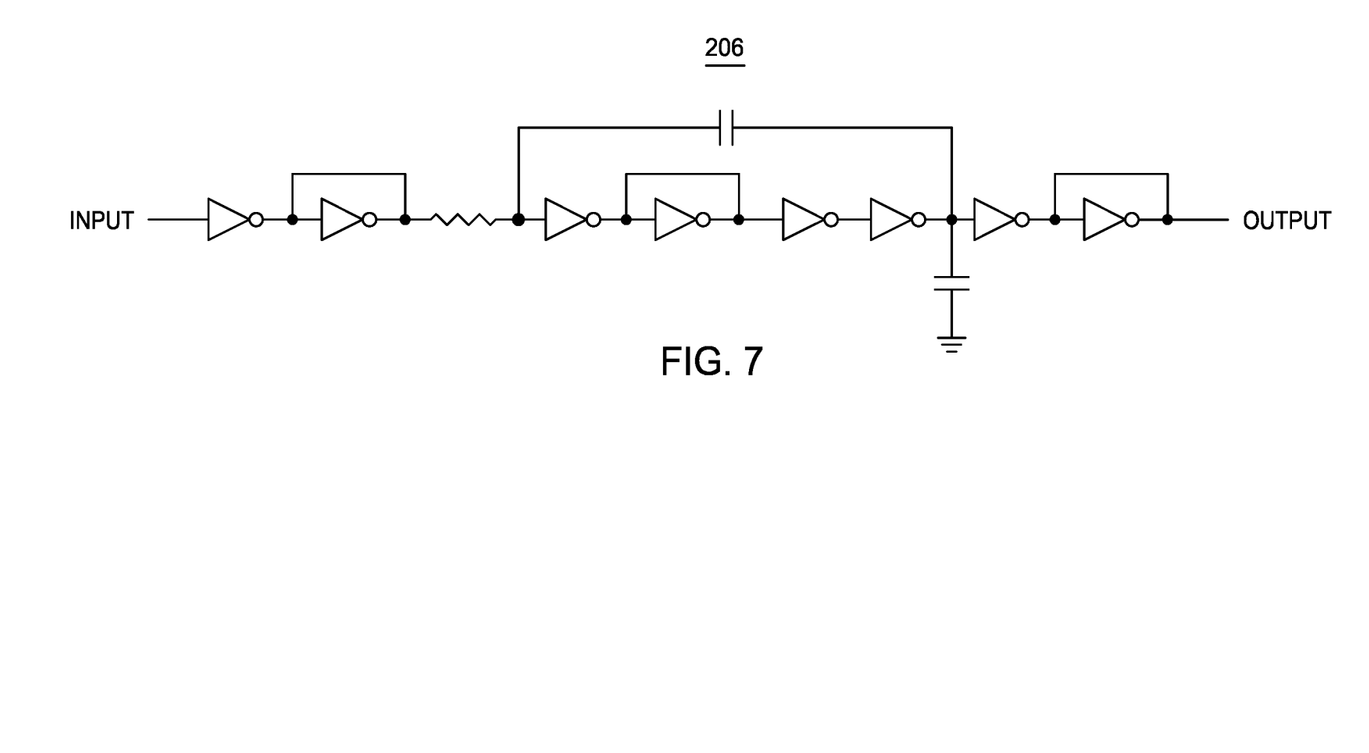
FIG. 7 illustrates an example feedback circuit of the integrated circuit in the system of FIG. 1.

FIG. 7 illustrates an example feedback circuit 206 of the integrated circuit in the system 100 of FIG. 1. As seen in FIG. 7, the feedback circuit 206 includes a series of inverters and analog circuit components that detect a DC component of an input signal and that generate an output based on that DC component.

Figure 8:
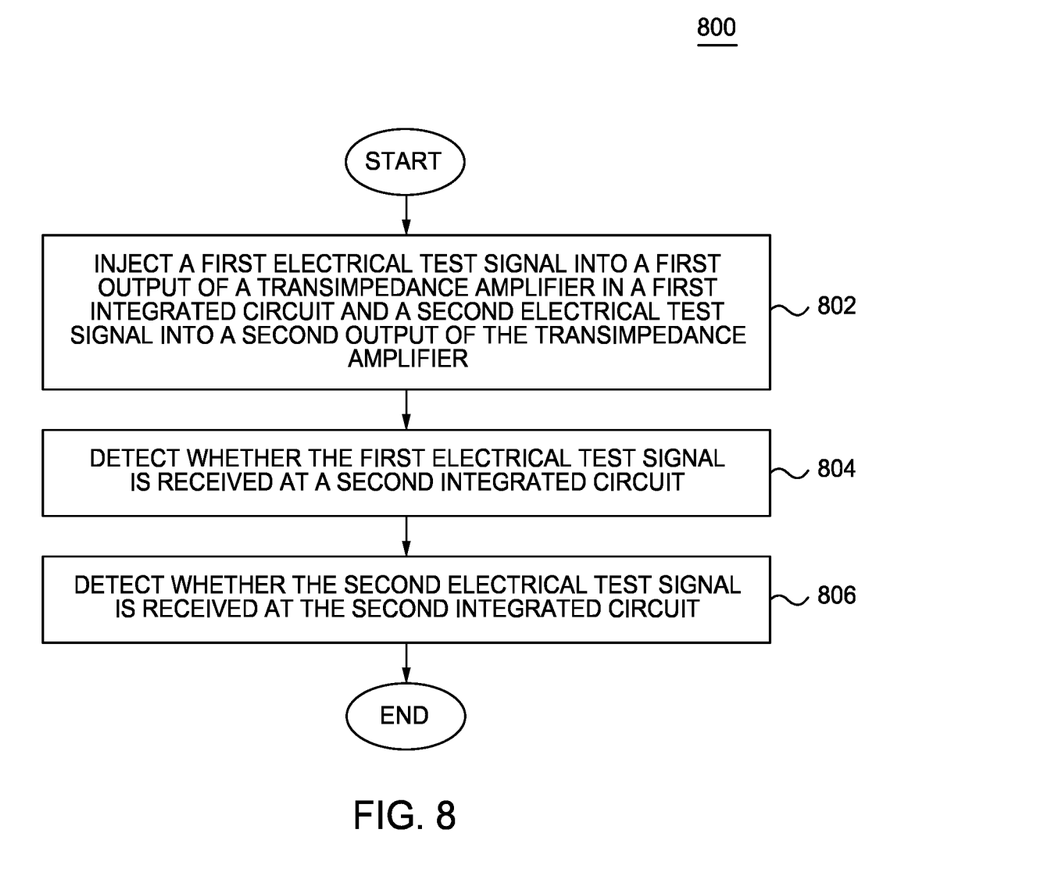
FIG. 8 is a flowchart of an example method performed in the system of FIG. 1.

FIG. 8 is a flowchart of an example method 800 performed in the system 100 of FIG. 1. In certain embodiments, various components of the system 100 (e.g., the integrated circuit 101, the controller 103, and the sensor 109) perform the method 800. By performing the method 800, a connection between integrated circuits is tested using electrical test signals.

In block 802, a first injection circuit 106 injects a first electrical test signal into a first output of a transimpedance amplifier 108 of a first integrated circuit 101 and a second injection circuit 106 injects a second electrical test signal into a second output of the transimpedance amplifier 108. The first and second electrical test signals travel from the outputs of the transimpedance amplifier 108 out of the integrated circuit 101. These electrical test signals may be used to determine whether the integrated circuit 101 is faulty (e.g., whether one of more output connections of the integrated circuit 101 are faulty).

In block 804, the controller 103 or the sensor 109 detects whether the first electrical test signal is received at another integrated circuit 111 connected to the integrated circuit 101. If the connection between the integrated circuit 101 and the other integrated circuit 111 is not faulty, then the first electrical test signal should travel through the connection to the other integrated circuit 111. If the connection is faulty, then the first electrical test signal may not be detected at the other integrated circuit 111.

In block 806, the controller 103 or the sensor 109 detects whether the second electrical test signal is received at the other integrated circuit 111. If the connection between the integrated circuit 101 and the other integrated circuit 111 is faulty, then the second electrical test signal may not be received at the other integrated circuit 111. If the connection is not faulty, then the second electrical test signal may be detected at the other integrated circuit.

Figure 9:
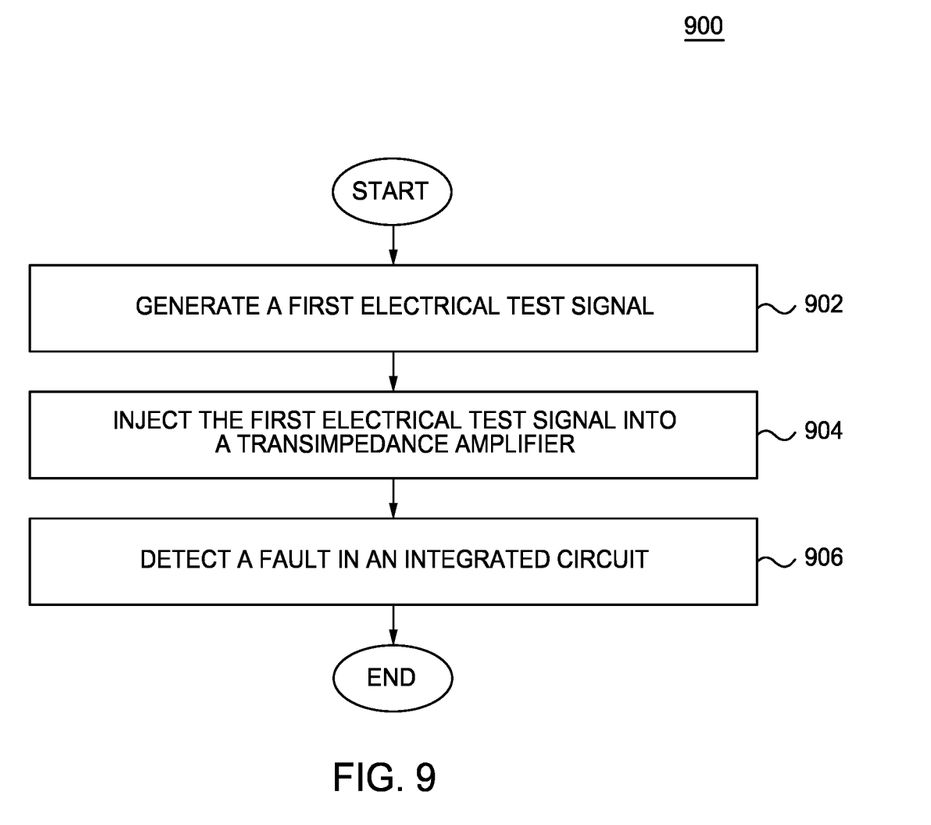
FIG. 9 is a flowchart of an example method performed in the system of FIG. 1.

FIG. 9 is a flowchart of an example method 900 performed in the system 100 of FIG. 1. In particular embodiments, by performing the method 900, a transimpedance amplifier 108 in the integrated circuit 101 is tested using electrical test signals.

In block 902, an injection circuit 106 generates a first electrical test signal. The injection circuit 106 may generate the first electrical test signal in any suitable manner. For example, the injection circuit 106 may use PAM4 encoding to encode a multi-bit signal into the first electrical test signal. As another example, the injection circuit 106 may convert an NRZ signal into the first electrical test signal.

In block 904, the injection circuit 106 injects the first electrical test signal into the transimpedance amplifier 108. The injection circuit 106 may inject the first electrical test signal into any portion of the transimpedance amplifier 108. For example, the injection circuit 106 may inject the first electrical test signal into an input of the transimpedance amplifier 108. The first electrical test signal then travels through the transimpedance amplifier 108 to produce an output voltage. As another example, the injection circuit 106 may inject the first electrical test signal into an output of the transimpedance amplifier 108 to simulate an output of the transimpedance amplifier 108. The first electrical test signal then travels from the transimpedance amplifier 108 to another component connected to the transimpedance amplifier 108. As yet another example, the injection circuit 106 may inject the first electrical test signal into a component of the transimpedance amplifier 108, such as a programmable gain amplifier and output driver 204. The first electrical test signal travels through the component of the transimpedance amplifier 108 to produce the output voltage of the transimpedance amplifier 108.

In block 906, a controller 103 or a sensor 109 detects a fault in the integrated circuit 101 based on the first electrical test signal. For example, the controller 103 or the sensor 109 may measure or analyze the output voltage of the transimpedance amplifier 108 when the first electrical test signal is injected into the input of the transimpedance amplifier 108 or an input of a component of the transimpedance amplifier 108. By measuring the output voltage of the transimpedance amplifier 108, the controller 103 or the sensor 109 may detect whether the transimpedance amplifier 108 handled the first electrical test signal properly. If the transimpedance amplifier 108 did not handle the first electrical test signal properly, then a fault is detected in the transimpedance amplifier 108. As another example, the controller 103 or the sensor 109 may detect whether the first electrical test signal reached a component that is connected to the transimpedance amplifier 108 when the first electrical test signal is injected into the output of the transimpedance amplifier 108. If the first electrical test signal reached the other component, then the output connection from the integrated circuit 101 is verified. If the first electrical test signal does not reach the other component, then the output connection from the integrated circuit 101 is faulty.

The fault detection processes discussed in the foregoing may be used during any suitable testing process involving the integrated circuit 101. For example, during low speed wafer level or chip on wafer level testing, an injection circuit 106 may inject electrical test signals into an input of the transimpedance amplifier 108 or an input of a component of the transimpedance amplifier 108 to detect faults in the transimpedance amplifier 108. In some embodiments, automated test equipment may be used to control and adjust the electrical test signals. As another example, during chip to chip testing, electrical test signals may be injected into the outputs of the transimpedance amplifier 108 or the inputs of the transimpedance amplifier 108 to detect whether another component receives signals from the transimpedance amplifier 108. As yet another example, during high temperature operating life device qualification, electrical test signals may be injected when the integrated circuit 101 is exposed to high temperature conditions to determine whether faults form in the integrated circuit 101. During electro static discharge qualification, electrical test signals may be injected after applying an electrostatic discharge to the integrated circuit 101 to determine whether faults form in the integrated circuit 101. In each of these examples, the integrated circuit 101 is tested using electrical test signals rather than optical signals. As a result, the integrated circuit 101 may be tested before assembling or connecting optical components to the integrated circuit 101.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An integrated circuit comprising:
a transimpedance amplifier;
a first injection circuit configured to:
generate a first electrical test signal; and
inject the first electrical test signal into the transimpedance amplifier; and
a second injection circuit configured to inject a second electrical test signal into the transimpedance amplifier, wherein the first electrical test signal or an output of the transimpedance amplifier generated based on the first electrical test signal is used to determine whether the integrated circuit is faulty.

2. The integrated circuit of claim 1, wherein the first and second electrical test signals are not generated based on an optical signal.

3. The integrated circuit of claim 1, wherein the first and second electrical test signals sum to zero.

4. The integrated circuit of claim 1, wherein the first and second electrical test signals are injected into a programmable gain amplifier of the transimpedance amplifier.

5. The integrated circuit of claim 1, wherein the first injection circuit is configured to receive at least one bit and to generate the first electrical test signal based on the at least one bit.

6. The integrated circuit of claim 1, wherein an electrostatic discharge is applied to the integrated circuit before the first injection circuit injects the first electrical test signal.

7. A method comprising:
generating, by a first injection circuit in an integrated circuit, a first electrical test signal;
injecting, by the first injection circuit, the first electrical test signal into a transimpedance amplifier in the integrated circuit;
injecting, by a second injection circuit in the integrated circuit, a second electrical test signal into the transimpedance amplifier; and
determining, based on the first electrical test signal or an output of the transimpedance amplifier generated based on the first electrical test signal, whether the integrated circuit is faulty.

8. The method of claim 7, wherein the first electrical test signal is injected at an input of the transimpedance amplifier.

9. The method of claim 7, wherein the first electrical test signal is injected at a first input of a programmable gain amplifier of the transimpedance amplifier.

10. The method of claim 9, wherein the second electrical test signal is injected into a second input of the programmable gain amplifier.

11. The method of claim 10, wherein the first and second electrical test signals sum to zero.

12. The method of claim 7, further comprising:
communicating the output of the transimpedance amplifier to a second integrated circuit; and
adjusting the first electrical test signal based on an output of the second integrated circuit.

13. The method of claim 7, further comprising adding a feedback signal from the transimpedance amplifier to the first electrical test signal.

14. The method of claim 7, wherein the first electrical test signal is not generated based on an optical signal.

15. A system comprising:
a first integrated circuit comprising:
a transimpedance amplifier;
a first injection circuit configured to inject a first electrical test signal into an output of the transimpedance amplifier; and
a second injection circuit configured to inject a second electrical test signal into a second output of the first integrated circuit when the first electrical test signal is injected into the transimpedance amplifier; and
a second integrated circuit connected to the first integrated circuit, wherein a fault in a connection between the first integrated circuit and the second integrated circuit is determined based on whether the first electrical test signal is received at an input of the second integrated circuit.

16. The system of claim 15, wherein the first and second electrical test signals sum to zero.

17. The system of claim 15, wherein a fault in a second connection between the first integrated circuit and the second integrated circuit is determined based on whether the second electrical test signal is received at a second input of the second integrated circuit.

18. The system of claim 15, wherein the first integrated circuit further comprises a feedback circuit connected to the output of the transimpedance amplifier, wherein the feedback circuit is configured to generate a feedback signal, and wherein the feedback signal is received at an input of a programmable gain amplifier of the transimpedance amplifier.

* * * * *